United States Patent
Chung et al.

(10) Patent No.: US 11,112,302 B2
(45) Date of Patent: Sep. 7, 2021

(54) METHOD OF SWITCHING CONTROL VOLTAGE OF PHOTO SENSOR CELL AND RELATED SWITCHING CIRCUIT AND PHOTO SENSOR

(71) Applicant: NOVATEK Microelectronics Corp., Hsin-Chu (TW)

(72) Inventors: Jung-Chen Chung, Hsinchu County (TW); Chi-Ting Chen, Hsinchu (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 121 days.

(21) Appl. No.: 16/290,948

(22) Filed: Mar. 3, 2019

(65) Prior Publication Data
US 2020/0278246 A1   Sep. 3, 2020

(51) Int. Cl.
G01J 1/44 (2006.01)
H03K 3/356 (2006.01)

(52) U.S. Cl.
CPC .......... *G01J 1/44* (2013.01); *H03K 3/356113* (2013.01)

(58) Field of Classification Search
CPC .......... H01L 27/14609; H01L 27/14612; G01J 1/44; H03K 3/356113; H04N 5/378; H04N 5/3698; H04N 5/353; H04N 5/361; H04N 5/3765; H04N 5/376; H04N 5/35554; H04N 5/35581
See application file for complete search history.

(56) References Cited

U.S. PATENT DOCUMENTS

| 8,792,037 | B2* | 7/2014 | Hasegawa | H04N 5/3742 348/308 |
| 2006/0023096 | A1* | 2/2006 | Watanabe | H01L 27/14643 348/302 |
| 2006/0097296 | A1* | 5/2006 | Nam | H04N 5/35554 257/292 |
| 2007/0188194 | A1 | 8/2007 | Yang | |
| 2010/0110258 | A1 | 5/2010 | Mheen | |
| 2017/0041539 | A1* | 2/2017 | Barbier | H04N 5/361 |

FOREIGN PATENT DOCUMENTS

| CN | 101604911 A | 12/2009 |
| CN | 1791185 B | 9/2011 |
| CN | 103247334 A | 8/2013 |
| CN | 106997753 A | 8/2017 |
| CN | 108919872 A | 11/2018 |
| CN | 109274263 A | 1/2019 |

OTHER PUBLICATIONS

Cao Shihua et al., "Design of a High-Efficiency Low Turn-on Voltage CMOS Rectifier Circuit", <Semiconductor Integrated Circuits> vol. 41, No. 10, pp. 736-739, 745, Oct. 3, 2016.

* cited by examiner

*Primary Examiner* — Jennifer D Bennett
(74) *Attorney, Agent, or Firm* — Winston Hsu (57) ABSTRACT

A method of switching a control voltage of a photo sensor cell for a photo sensor includes when the photo sensor cell is switched from a turned-off state to an turned-on state, sequentially switching the control voltage to at least one first voltage provided by at least one first voltage supply, and switching the control voltage to a first target voltage provided by a first charging pump circuit; and when the photo sensor cell is switched from the turned-on state to the turned-off state, sequentially switching the control voltage to at least one second voltage provided by at least one second voltage supply or a ground voltage, and switching the control voltage to a second target voltage provided by a second charging pump circuit.

15 Claims, 5 Drawing Sheets

METHOD OF SWITCHING CONTROL VOLTAGE OF PHOTO SENSOR CELL AND RELATED SWITCHING CIRCUIT AND PHOTO SENSOR

BACKGROUND OF THE INVENTION

1. Field of the Invention

The present invention relates to a method of switching a control voltage of a photo sensor cell for a photo sensor and related switching circuit and photo sensor.

2. Description of the Prior Art

In a photo sensor, a switching circuit of a photo sensor cell uses a first target voltage higher than a system voltage of the photo sensor cell to firmly turn on a signal path for a read-out circuit of the photo sensor. Also, the switching circuit uses a second target voltage lower than a ground voltage of the photo sensor cell to firmly turn off the signal path for the read-out circuit, which avoids dark current flowing on the signal path. Conventionally, the photo sensor uses a first voltage charging pump circuit to provide the first target voltage, and a second voltage charging pump circuits to provide a second target voltage.

Figure 6:
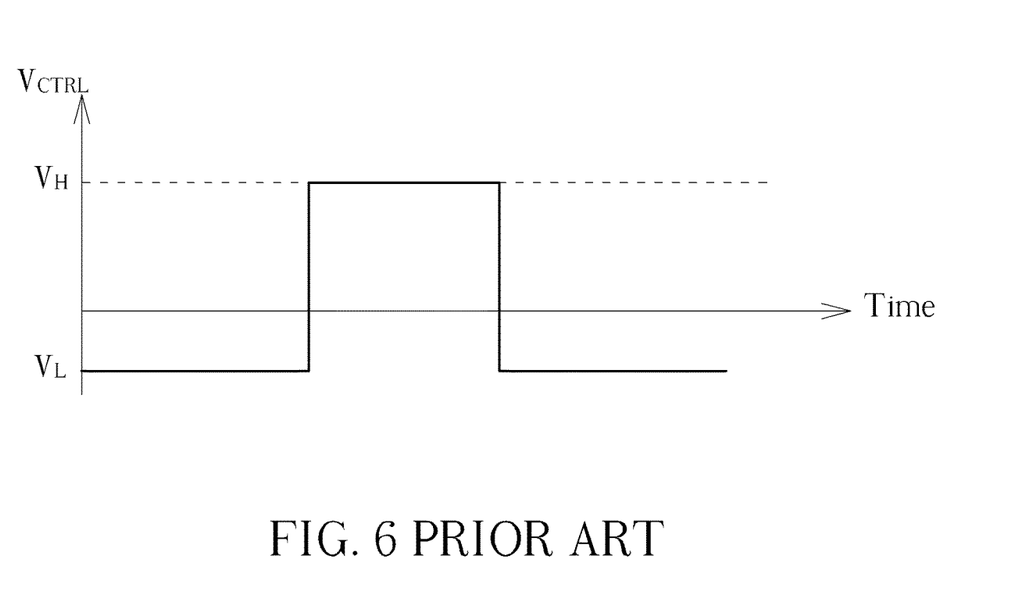
FIG. 6 is a signal diagram of a control voltage according to the prior art.

FIG. 6 is a signal diagram of a control voltage $V_{CTRL}$ according to the prior art. The switching circuit generates the control voltage $V_{CTRL}$ to turn on or off the signal path for the read-out circuit.

For reading charges of a photo diode by the read-out circuit, the switching circuit switches the control voltage $V_{CTRL}$ from a second target voltage $V_L$ to a first target voltage $V_H$. The first charging pump circuit provides a turn-on energy $E_{ON}=V_H*(V_H-V_L)*C_P$, wherein $C_P$ is a capacitance equivalent to a positive charging path.

For not reading charges of the photo diode by the read-out circuit, the switching circuit switches the control voltage $V_{CTRL}$ from the first target voltage $V_H$ to the second target voltage $V_L$. The second charging pump circuit provides a turn-off energy $E_{OFF}=V_L*(V_L-V_H)*C_P$, wherein $C_P$ is a capacitance equivalent to a negative charging path.

However, every time the switching circuit switches the control voltage $V_{CTRL}$ between the first target voltage $V_H$ and the second target voltage $V_L$, the first and second charging pump circuits have to pay cost such as certain amounts of operating frequency and flying capacitance to provide the charging current and energy to reach the required voltage level (e.g., switching from the second target voltage $V_L$ to the first target voltage $V_H$, or switching from the first target voltage $V_H$ to the second target voltage $V_L$).

Therefore, how to reduce the charging currents of the voltage charging pump circuits has become a topic in the industry.

SUMMARY OF THE INVENTION

It is therefore an objective of the present invention to provide a method of switching a control voltage of a photo sensor cell for a photo sensor and related switching circuit and photo sensor capable of reducing the charging currents of the voltage charging pump circuits.

The present invention discloses a method of switching a control voltage of a photo sensor cell for a photo sensor. The method includes when the photo sensor cell is switched from a turned-off state to an turned-on state, sequentially performing the following steps: sequentially switching the control voltage to at least one first voltage provided by at least one first voltage supply; switching the control voltage to a first target voltage provided by a first charging pump circuit, wherein the first target voltage is different from the at least one first voltage; and when the photo sensor cell is switched from the turned-on state to the turned-off state, sequentially performing the following steps: sequentially switching the control voltage to at least one second voltage provided by at least one second voltage supply or a ground voltage; and switching the control voltage to a second target voltage provided by a second charging pump circuit, wherein the second target voltage is different from the at least one second voltage.

The present invention further discloses a switching circuit for switching a control voltage of a sensor cell for a photo sensor. The switching circuit includes at least one first voltage node, configured to receive at least one first voltage from at least one first voltage supply; at least one second voltage node, configured to receive at least one second voltage from at least one second voltage supply or a ground voltage, wherein the first target voltage is different from the at least one first voltage; a third voltage node, configured to receive a first target voltage from at least one first charge pump circuit; a fourth voltage node, configured to receive a second target voltage from at least one second charge pump circuit, wherein the second target voltage is different from the at least one second voltage; a control block, configured to generate a control voltage equal to one of the at least one first voltage, the at least one second voltage, the first target voltage, and the second target voltage. The control block is configured to perform steps as above mentioned.

The present invention further discloses a photo sensor including a photo sensor cell; a first charging pump circuit configured to provide a first target voltage; at least one first voltage supply configured to provide at least one first voltage; a second charging pump circuit configured to provide a second target voltage; at least one second voltage supply configured to provide at least one second voltage; and the switching circuit as above mentioned and coupled to the photo sensor cell, the first charging pump circuit, the at least one first voltage supply, the second charging pump circuit and the at least one second voltage supply.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
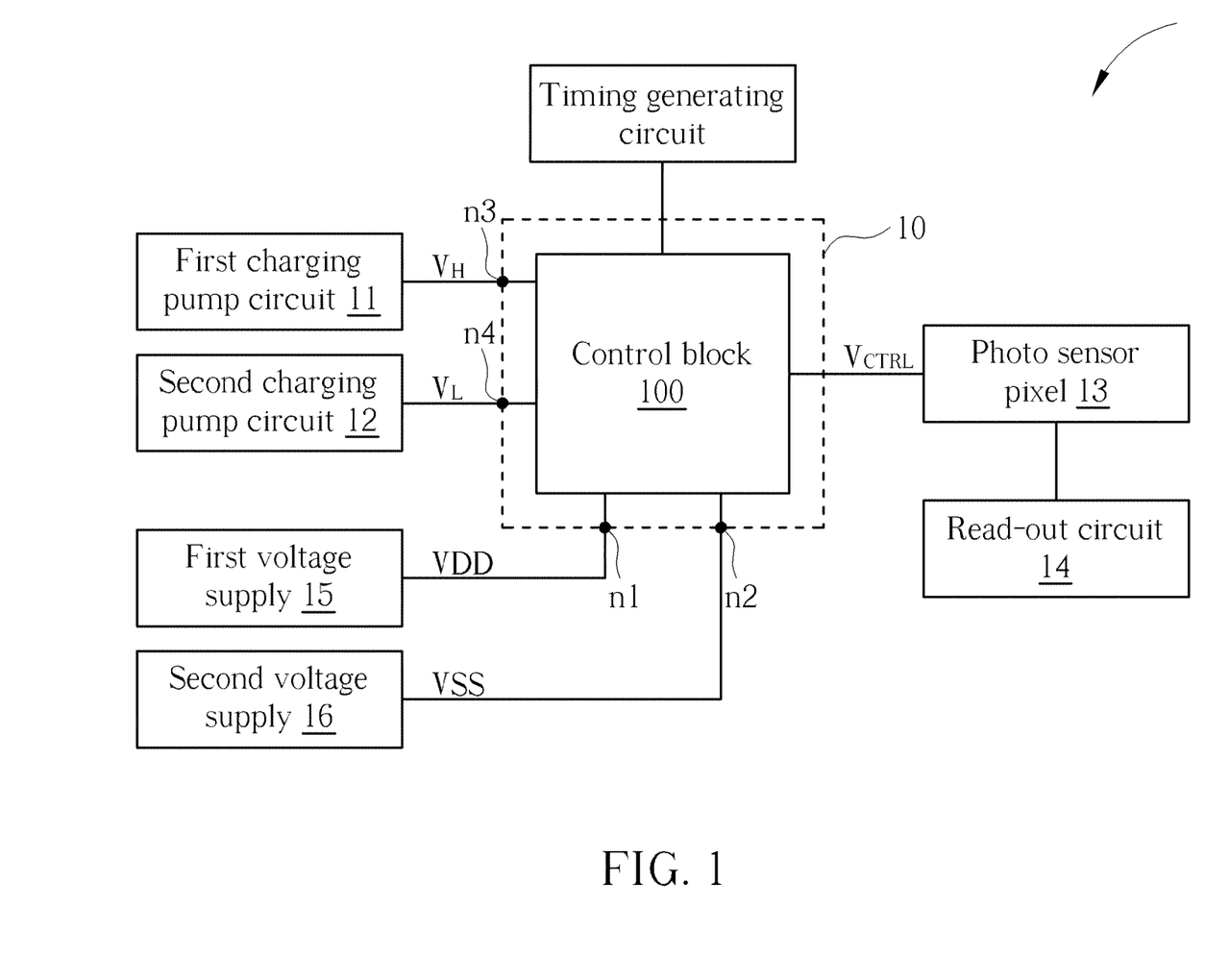
FIG. 1 is a schematic diagram of a photo sensor according to an embodiment of the present invention.

FIG. 1 is a schematic diagram of a photo sensor 1 according to an embodiment of the present invention. The photo sensor 1 includes a switching circuit 10, a first charging pump circuit 11, a second charging pump circuit 12, a photo sensor cell 13, a read-out circuit 14, a first voltage supply 15, and a second voltage supply 16.

The switching circuit 10 is coupled to the photo sensor cell 13, the first charging pump circuit 11, the first voltage supply 15, the second charging pump circuit 12 and the second voltage supply 16, and includes a first voltage node, a second voltage node, a third voltage node, a fourth voltage node and a control block 100.

The first voltage node is configured to receive a first voltage VDD from the first voltage supply 15. The second voltage node is configured to receive a second voltage VSS from the second voltage supply 16 or a ground voltage GND. The third voltage node is configured to receive a first target voltage $V_H$ from the first charge pump circuit 11, wherein the first target voltage $V_H$ is different from the first voltage VDD. The fourth voltage node is configured to receive a second target voltage $V_L$ from the second charge pump circuit 12, wherein the second target voltage $V_L$ is different from the second voltage VSS. The control block 100 is configured to generate a control voltage $V_{CTRL}$. The control voltage $V_{CTRL}$ can be equal to one of the first voltage VDD, the second voltage VSS, the first target voltage $V_H$, and the second target voltage $V_L$.

Figure 2A:
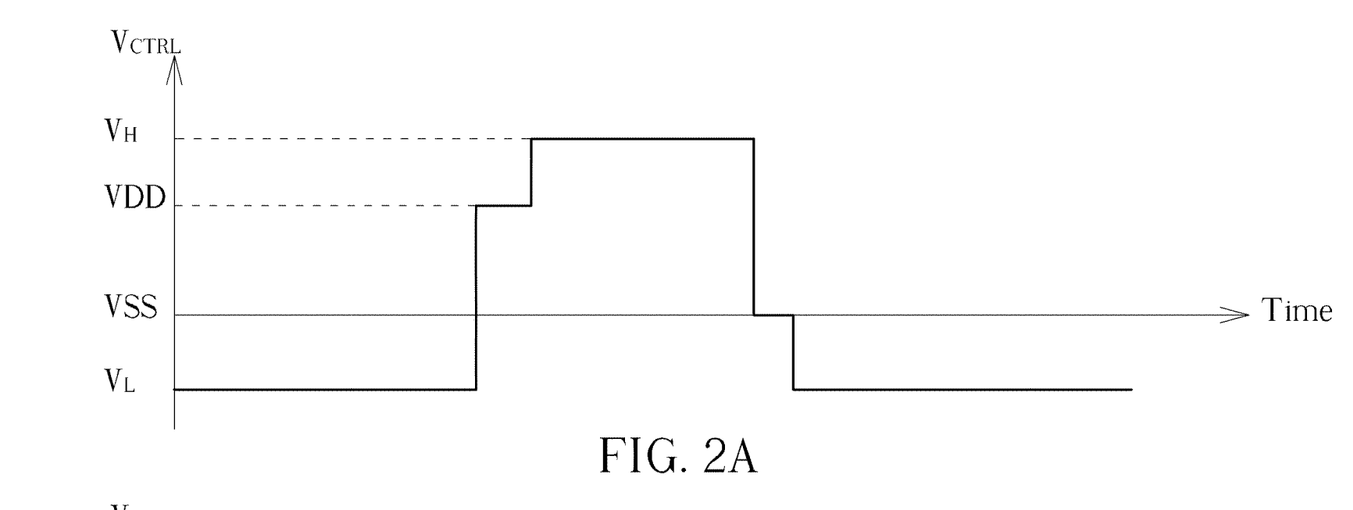
FIG. 2A is a signal diagram of the control voltage according to an embodiment of the present invention.

FIG. 2A is a signal diagram of the control voltage $V_{CTRL}$ according to an embodiment of the present invention. When the photo sensor cell 13 is switched from a turned-off state to a turned-on state, the switching circuit 10 sequentially switches the control voltage $V_{CTRL}$ to the first voltage VDD provided by the first voltage supply 15 and switches the control voltage $V_{CTRL}$ to the first target voltage $V_H$ provided by the first charging pump circuit 11, wherein the first target voltage $V_H$ is different from the first voltage VDD. When the photo sensor cell 13 is switched from the turned-on state to the turned-off state, the switching circuit 10 sequentially switches the control voltage $V_{CTRL}$ to the second voltage VSS provided by the second voltage supply 16, and switches the control voltage $V_{CTRL}$ to the second target voltage $V_L$ provided by the second charging pump circuit 12.

Note that when the photo sensor cell 13 is switched to the turned-on state and the control voltage $V_{CTRL}$ is pulled up from the first voltage VDD to the first target voltage $V_H$, a first energy $E_{ON}$ provided by the first charging pump circuit 11 may be denoted with a function of $E_{ON}=V_H*(V_H-VDD)*C_P$, wherein $C_P$ is a capacitance which is equivalent to a positive charging path to the photo sensor cell 13.

When the photo sensor cell 13 is switched to the turned-off state and the control voltage $V_{CTRL}$ is pulled down from the second voltage VSS to the second target voltage $V_L$, a second energy $E_{OFF}$ provided by the second charging pump circuit 12 may be denoted with a function of $E_{OFF}=V_L*(V_L-VSS)*C_P$, wherein $C_P$ is a capacitance equivalent to a negative charging path to the photo sensor cell 13.

Therefore, by sequentially switching operations of the switching circuit 10, the first charging pump circuit 11 provides the less first energy $E_{ON}=V_H*(V_H-VDD)*C_P$ for the positive charging path to the photo sensor cell 13 in comparison with the energy $E_{ON}=V_H*(V_H-V_L)*C_P$ of the prior art. Also, the second charging pump circuit 12 provides the less second energy $E_{OFF}=V_L*(V_L-VSS)*C_P$ for the negative charging path to the photo sensor cell 13 in comparison with the energy $E_{OFF}=V_L*(V_L-V_H)*C_P$ of the prior art.

Figure 2B:
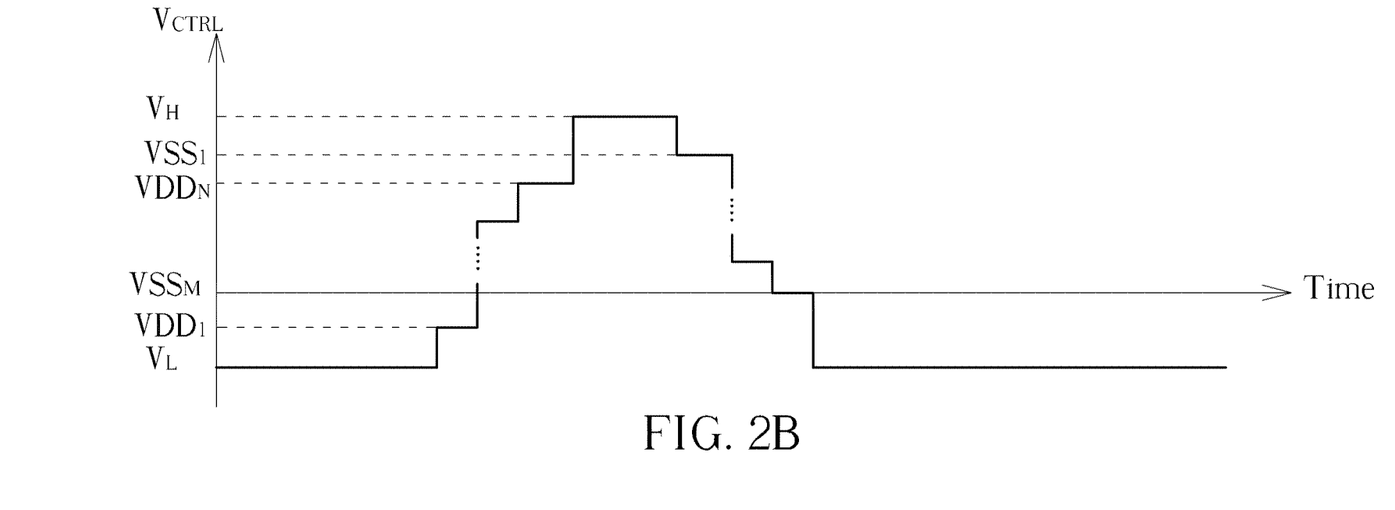
FIG. 2B is a signal diagram of the control voltage according to an embodiment of the present invention.

FIG. 2B is a signal diagram of the control voltage $V_{CTRL}$ according to an embodiment of the present invention. When the photo sensor cell 13 is switched from a turned-off state to a turned-on state, the switching circuit 10 sequentially switches the control voltage $V_{CTRL}$ to a plurality of first voltages $VDD_1$ to $VDD_N$ which may be provided by the different voltage supplies and switches the control voltage $V_{CTRL}$ to the first target voltage $V_H$ provided by the first charging pump circuit 11. Each of the first voltages $VDD_1$ to $VDD_N$ can be lower than the first target voltage $V_H$. Alternatively or additionally, when the photo sensor cell 13 is switched from the turned-on state to the turned-off state, the switching circuit 10 sequentially switches the control voltage $V_{CTRL}$ to a plurality of second voltages $VSS_1$ to $VSS_M$ which can be provided by different voltage supplies, and switches the control voltage $V_{CTRL}$ to the second target voltage $V_L$ provided by the second charging pump circuit 12. Each of the second voltages $VSS_1$ to $VSS_M$ can be higher than the second target voltage $V_L$. In an embodiment, one of the first voltages is a power supply voltage (e.g., VDD) lower than the first target voltage $V_H$, and one of the second voltages is a ground voltage GND higher than the second target voltage $V_L$.

Figure 3:
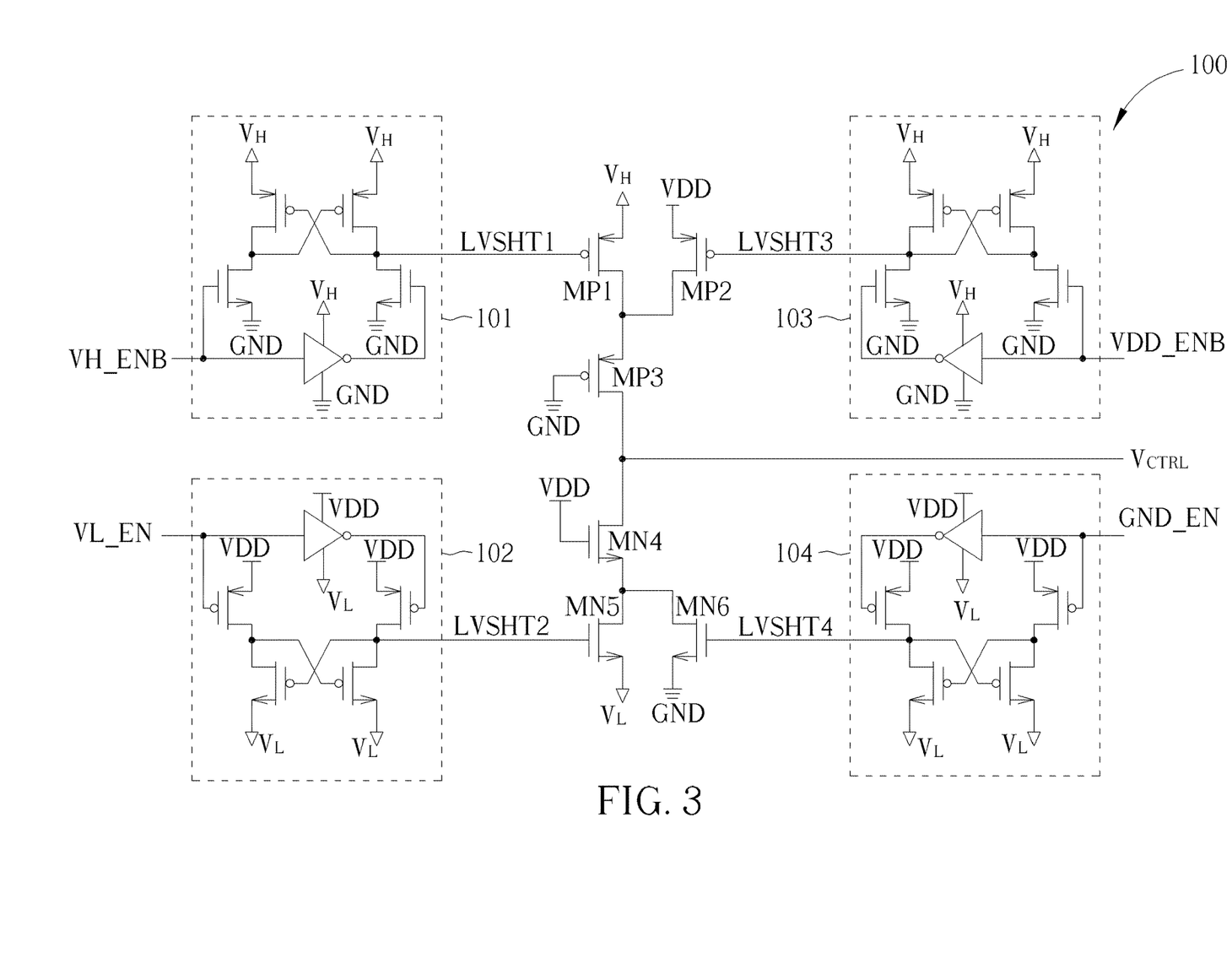
FIG. 3 is a schematic diagram of a control block according to an embodiment of the present invention.

FIG. 3 is a schematic diagram of the control block 100 according to an embodiment of the present invention. In this embodiment, the second voltage VSS equals the ground voltage GND, which is not limited. The control block 100 includes a first P-type transistor MP1, a second P-type transistor MP2, a third P-type transistor MP3, a first N-type transistor MN4, a second N-type transistor MN5, a third N-type transistor MN6, a first level shifter 101, a second level shifter 102, a third level shifter 103 and a fourth level shifter 104.

The first P-type transistor MP1 includes a source coupled to the first target voltage $V_H$, a gate coupled to a first level shift voltage LVSHT1. The second P-type transistor includes a source coupled to the first voltage VDD, a gate coupled to a third level shift voltage LVSHT3, and a drain coupled to a drain of the first P-type transistor MP1. The third P-type transistor includes a source coupled to the drain of the first P-type transistor MP1, and a gate coupled to the second voltage GND, and a drain configured to output the control voltage $V_{CTRL}$. The first N-type transistor MN4 includes a drain coupled to the drain of the third P-type transistor MP3, a gate coupled to the first voltage VDD. The second N-type transistor MN5 includes a drain coupled to a source of the first N-type transistor MN4, a gate coupled to a second level shift voltage LVSHT2, and a source coupled to the second target voltage $V_L$. The third N-type transistor MN6 includes a drain coupled to the source of the first N-type transistor MN4, a gate coupled to a fourth level shift voltage LVSHT4, and a source coupled to the second voltage GND.

The first level shifter 101 is coupled to and the first target voltage $V_H$ and the second voltage GND, and configured to provide the first level shift voltage LVSHT1 according to a first target voltage enable signal VH_ENB. The second level shifter 102 is coupled to the first voltage VDD and the second target voltage $V_L$, and configured to provide the second level shift voltage LVSHT2 according to a second target voltage enable signal VL_ENB. The third level shifter unit 103 is coupled to the first target voltage $V_H$ and the first voltage VDD, and configured to provide the third level shift voltage LVSHT3 according to a first voltage enable signal VDD_ENB. The fourth level shifter 104 is coupled to the second target voltage $V_L$ and the first voltage VDD, and configured to provide the fourth level shift voltage LVSHT4 according to a second voltage enable signal GND EN.

The first level shifter 101 and the third level shifter 103 can be structurally identical. For example, the first level shifter 101 includes a fourth P-type transistor, a fifth P-type transistor, a fourth N-type transistor, a fifth N-type transistor, and a first NOT gate. The fourth P-type transistor includes a source coupled to the first target voltage $V_H$, and a gate coupled to the first level shift voltage LVSHT1. The fifth P-type transistor includes a source coupled to the first target voltage, and a gate coupled to a drain of the fourth P-type transistor, and a drain coupled to the gate of the fourth P-type transistor and the first level shift voltage LVSHT1. The fourth N-type transistor includes a drain coupled to the drain of the fourth P-type transistor, a gate coupled to the first target voltage enable signal VH_ENB, and a source coupled to the ground voltage GND. The fifth N-type transistor includes a drain coupled to the drain of the fifth P-type transistor, and a source coupled to the ground voltage GND. The first NOT gate includes an input terminal coupled to the gate of the fourth N-type transistor and the first target voltage enable signal VH_ENB and an output terminal coupled to a gate of the fifth N-type transistor, wherein a voltage swing of the first NOT gate is between the first target voltage $V_H$ and the second voltage GND.

The second level shifter 102 and the fourth level shifter 104 are structurally identical. For example, the second level shifter 102 including a second NOT gate, a sixth P-type transistor, a seventh P-type transistor, a sixth N-type transistor, and a seventh N-type transistor. The second NOT gate includes an input terminal coupled to a second target voltage enable signal VL_ENB, wherein a voltage swing of the second NOT gate is between the first voltage VDD and the second target voltage $V_L$. The sixth P-type transistor includes a source coupled to the first voltage VDD, a gate coupled to the input terminal of the second NOT gate and the second target voltage enable signal VL_EN, and a drain coupled to the second level shift voltage LVSHT2. The seventh P-type transistor includes a source coupled to the first voltage VDD, a gate coupled to an output terminal of the second NOT gate, and a drain coupled the second level shift voltage LVSHT2. The sixth N-type transistor includes a drain coupled to the drain of the sixth P-type transistor, a gate coupled to the second level shift voltage LVSHT2, and a source coupled to the second target voltage $V_L$. The seventh N-type transistor includes a drain coupled to the gate of the sixth N-type transistor and the second level shift voltage LVSHT2, a gate coupled to the drain of the sixth N-type transistor, and a source coupled to the second target voltage $V_L$.

Figure 4:
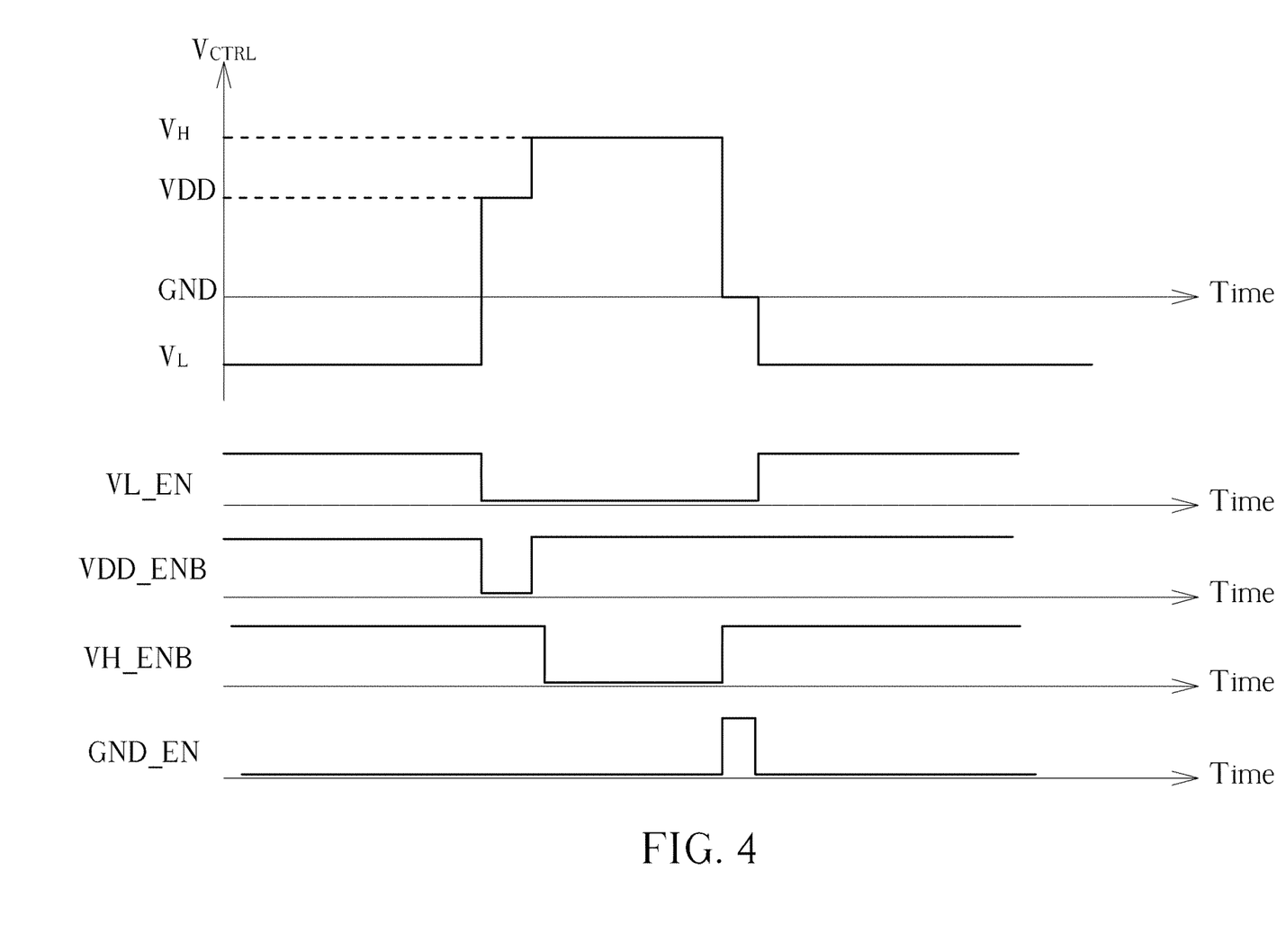
FIG. 4 is a timing control diagram according to an embodiment of the present invention.

FIG. 4 is a timing control diagram of the control voltage $V_{CTRL}$, the second target voltage enable signal VL_EN, the first voltage enable signal VDD_ENB, the first target voltage enable signal VH_ENB and the second voltage enable signal GND EN according to an embodiment of the present invention. Table 1 illustrates voltage logic values (e.g., logic 1 or logic 0) corresponding to the signal diagrams shown in FIG. 4.

TABLE 1

| $V_{CTRL}$ | $V_L$ | VDD | $V_H$ | GND (VSS) |
|---|---|---|---|---|
| VL_EN | 1 | 0 | 0 | 0 |
| VDD_ENB | 1 | 0 | 1 | 1 |
| VH_ENB | 1 | 1 | 0 | 1 |
| GND_EN | 0 | 0 | 0 | 1 |

For example, when the first target voltage enable signal VH_ENB enables the first level shift voltage LVSHT1 to turn on the first P-type transistor MP1 to provide the first target voltage $V_H$ to the control voltage $V_{CTRL}$, the second N-type transistor MN5, the second P-type transistor MP2, and the third N-type transistor MN6 are turned off by the signals level shift voltages LVSHT2, LVSHT3 and LVSHT4. In an embodiment, the signals VL_EN, VDD_ENB, VH_ENB, and the GND EN are generated by a timing generating circuit of the photo sensor 1 as shown in FIG. 1.

Figure 5:
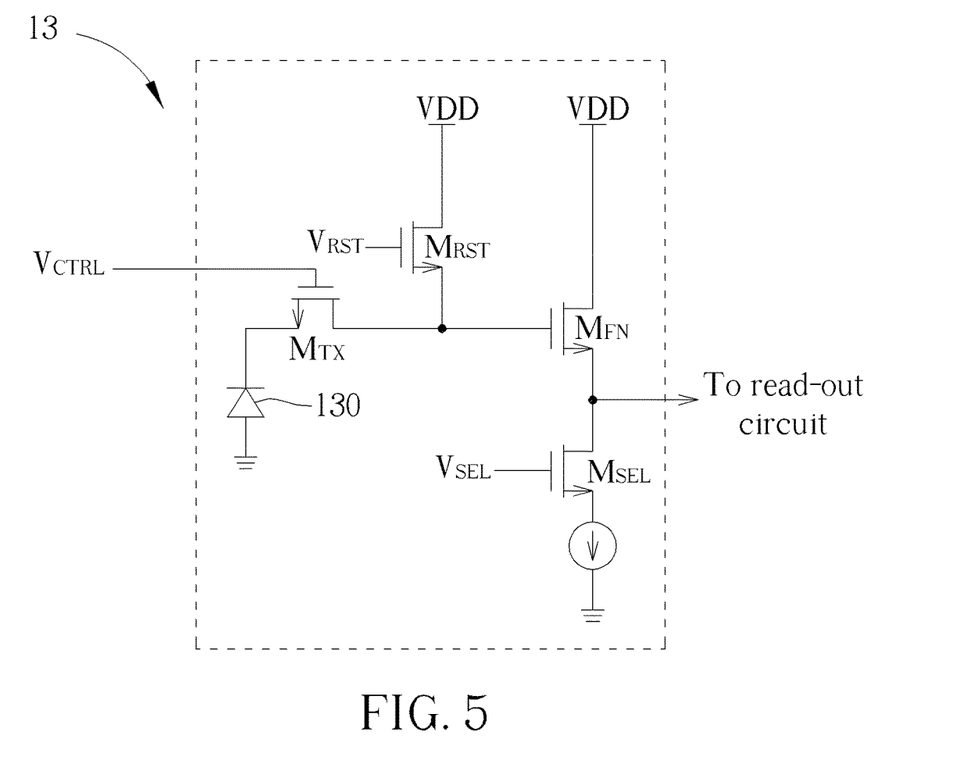
FIG. 5 is a schematic diagram of a photo sensor cell according to an embodiment of the present invention.

FIG. 5 is a schematic diagram of the photo sensor cell 13 according to an embodiment of the present invention. The photo sensor cell 13 is coupled between the switching circuit 10 and the read-out circuit 14, and configured to generate a read-out voltage $V_{OUT}$ to be read by the read-out circuit 14 according to the control voltage $V_{CTRL}$. The photo sensor cell 13 includes a photo diode 130, a first transistor $M_{TX}$, a second transistor $M_{RST}$, a third transistor $M_{FN}$, a fourth transistor $M_{SEL}$, and a current source.

The photo diode 130 includes an anode coupled to the ground voltage GND. The first transistor $M_{TX}$ includes a source coupled to a cathode of the photo diode 130, and a gate coupled to the control voltage $V_{CTRL}$. The second transistor $M_{RST}$ includes a source coupled to a drain of the first transistor, a gate coupled to a reset voltage $V_{RST}$ of photo sensor 10, and a drain coupled to a system voltage VDD of the photo sensor 10. The third transistor $M_{FN}$ includes a source coupled to the read-out circuit 14, a gate coupled to the drain of the first transistor $M_{TX}$, and a drain coupled to the system voltage VDD of the photo sensor 10. The fourth transistor $M_{SEL}$ includes a drain coupled to source of the third transistor $M_{FN}$ and the read-out circuit 14, a gate coupled to a select voltage $V_{SEL}$ of the photo sensor 10. The current source is coupled between a source of the fourth transistor $M_{SEL}$ and the ground voltage GND.

In an embodiment, the circuit structure of FIG. 1 is also applicable to at least one of the reset voltage $V_{RST}$ and the select voltage $V_{SEL}$. Take the reset voltage $V_{RST}$ for example, the photo sensor 10 further includes a switching circuit coupled to the reset voltage $V_{RST}$, and configured to sequentially switch the reset voltage $V_{RST}$ from a second target voltage (e.g., $V_{L1}$) to a first voltage (e.g., VDD1), and switch the reset voltage $V_{RST}$ from the first voltage VDD1 to a first target voltage $V_{H1}$ when the second transistor $M_{RST}$ is switched from a turned-off state to a turn-on state. The switching circuit is further configured to sequentially switch the reset voltage $V_{RST}$ from the first target voltage $V_{H1}$ to a second voltage (e.g., VSS1 or GND), and switch the reset voltage $V_{RST}$ from the second voltage VSS1 to the second target voltage $V_{L1}$ when the second transistor $M_{RST}$ is switched from the turned-on state to the turn-off state. The photo sensor 10 further includes a first charging pump circuit configured to provide the first target voltage $V_{H1}$ for the reset voltage $V_{RST}$ and a second charging pump circuit configured to provide the second target voltage $V_{H1}$ for the reset voltage $V_{RST}$, wherein the second target voltage $V_{L1}$ for the reset voltage $V_{RST}$ may equal the second target voltage $V_L$.

To sum up, with the circuit structure and the sequentially switching operations of the switching circuit of the present invention, the energies provided by the charging pump circuits of the photo sensor of the present invention may be less than that of the photo sensor in the prior art to save power consumption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of switching a control voltage of a photo sensor cell for a photo sensor, comprising:
   when the photo sensor cell is switched from a turned-off state to a turned-on state, sequentially performing the following steps:
      sequentially switching the control voltage to at least one first voltage provided by at least one first voltage supply;
      switching the control voltage to a first target voltage provided by a first charging pump circuit, wherein the first target voltage is different from the at least one first voltage; and
   when the photo sensor cell is switched from the turned-on state to the turned-off state, sequentially performing the following steps:
      sequentially switching the control voltage to at least one second voltage provided by at least one second voltage supply or a ground voltage; and
      switching the control voltage to a second target voltage provided by a second charging pump circuit, wherein the second target voltage is different from the at least one second voltage;
   wherein a highest first voltage among the at least one first voltage is higher than a lowest second voltage among the at least one second voltage.

2. The method of claim 1, wherein each of the at least one first voltage is lower than the first target voltage.

3. The method of claim 1, wherein each of at least one second voltage is higher than the second target voltage.

4. The method of claim 1, wherein the at least one first voltage comprises a power supply voltage lower than the first target voltage, and the at least one second voltage comprises the ground voltage higher than the second target voltage.

5. A switching circuit for switching a control voltage of a sensor cell for a photo sensor, comprising:
   at least one first voltage node, configured to receive at least one first voltage from at least one first voltage supply;
   at least one second voltage node, configured to receive at least one second voltage from at least one second voltage supply or a ground voltage;
   a third voltage node, configured to receive a first target voltage from at least one first charge pump circuit, wherein the first target voltage is different from the at least one first voltage;
   a fourth voltage node, configured to receive a second target voltage from at least one second charge pump circuit, wherein the second target voltage is different from the at least one second voltage; and
   a control block, configured to generate a control voltage equal to one of the at least one first voltage, the at least one second voltage, the first target voltage, and the second target voltage, wherein
   when the photo sensor cell is switched from a turned-off state to a turned-on state, the control block is configured to sequentially perform the following steps:
      sequentially switching the control voltage to the at least one first voltage;
      switching the control voltage to a first target voltage; and
   when the photo sensor cell is switched from the turned-on state to the turned-off state, the control block is configured to sequentially perform the following steps:
      sequentially switching the control voltage to the at least one second voltage; and
      switching the control voltage to the second target voltage;
   wherein a highest first voltage among the at least one first voltage is higher than a lowest second voltage among the at least one second voltage.

6. The switching circuit of claim 5, wherein the control block comprises:
   a first P-type transistor having a source coupled to the first target voltage, a gate coupled to a first level shift voltage;
   a second P-type transistor having a source coupled to the at least one first voltage, a gate coupled to a second level shift voltage, and a drain coupled to a drain of the first P-type transistor;
   a third P-type transistor having a source coupled to the drain of the first P-type transistor, a gate coupled to the at least one second voltage, and a drain configured to output the control voltage;
   a first N-type transistor having a drain coupled to the drain of the third P-type transistor, a gate coupled to the at least one first voltage;
   a second N-type transistor having a drain coupled to a source of the first N-type transistor, a gate coupled to a third level shift voltage, and a source coupled to the second target voltage; and
   a third N-type transistor having a drain coupled to the source of the first N-type transistor, a gate coupled to a fourth level shift voltage, and a source coupled to the at least one second voltage.

7. The switching circuit of claim 6, wherein the control block comprises:
   a first level shifter coupled to the first target voltage, and configured to provide the first level shift voltage according to a first target voltage enable signal; and
   a second level shifter, coupled to the second target voltage, and configured to provide the second level shift voltage according to a second target voltage enable signal;
   a third level shifter unit coupled to the first target voltage, and configured to provide the third level shift voltage according to a first voltage enable signal; and
   a fourth level shifter, coupled to the second target voltage, and configured to provide the fourth level shift voltage according to a second voltage enable signal.

8. The switching circuit of claim 5, wherein each of the at least one first voltage is lower than the first target voltage.

9. The switching circuit of claim 5, wherein each of at least one second voltage is higher than the second target voltage.

10. The switching circuit of claim 5, wherein the at least one first voltage comprises a power supply voltage lower than the first target voltage, and the at least one second voltage comprises the ground voltage higher than the second target voltage.

11. A switching circuit to switch a control voltage of a photo sensor cell, comprising:
   a timing generating circuit; and
   a control block to output the control voltage to the photo sensor cell according to a timing signal from the timing generating circuit, wherein
   when the photo sensor cell is switched from a turned-off state to a turned-on state, the control block first pulls up the control voltage from a second target voltage to a first voltage, and then the control block pulls up the control voltage from the first voltage to a first target voltage;

wherein when the photo sensor cell is switched from the turned-on state to the turned-off state, the control block first pulls down the control voltage from the first target voltage to a second voltage, and then the control block pulls down the control voltage from the second voltage to the second target voltage;

wherein the first voltage is higher than the second voltage.

12. The circuit as claimed in claim 11, wherein the timing signal is a third timing signal, and the control block further comprises:

a third level shifter to maintain the control voltage to be the first voltage according to the third timing signal; and a first level shifter to maintain the control voltage to be the first target voltage according to a first timing signal.

13. The circuit as claimed in claim 12, wherein a maintenance duration of the first voltage of the control voltage is calculated according to the third timing signal and the first timing signal, and a maintenance duration of the first target voltage of the control voltage is calculated according to a low logic value of the first timing signal.

14. The circuit as claimed in claim 11, wherein the timing signal is a fourth timing signal, and the control block further comprises:

a fourth level shifter to maintain the control voltage to be the second voltage according to the fourth timing signal; and a second level shifter to maintain the control voltage to be the second target voltage according to a second timing signal.

15. The circuit as claimed in claim 14, wherein a maintenance duration of the second voltage of the control voltage is calculated according to the fourth timing signal and the second timing signal, and a maintenance duration of the second target voltage of the control voltage is calculated according to a low logic value of the second timing signal.

* * * * *